United States Patent
Mishra et al.

(10) Patent No.: US 8,558,285 B2
(45) Date of Patent: Oct. 15, 2013

(54) METHOD USING LOW TEMPERATURE WAFER BONDING TO FABRICATE TRANSISTORS WITH HETEROJUNCTIONS OF SI(GE) TO III-N MATERIALS

(75) Inventors: Umesh K. Mishra, Montecito, CA (US); Lee S. McCarthy, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/069,725

(22) Filed: Mar. 23, 2011

(65) Prior Publication Data
US 2011/0169050 A1 Jul. 14, 2011

Related U.S. Application Data

(63) Continuation of application No. 12/113,847, filed on May 1, 2008, now abandoned.

(60) Provisional application No. 60/915,334, filed on May 1, 2007.

(51) Int. Cl.
*H01L 29/72* (2006.01)

(52) U.S. Cl.
USPC ........... 257/213; 257/194; 257/196; 257/197; 257/200; 257/201; 257/E21.087; 257/E21.088; 257/E21.403; 257/E21.407; 257/E29.246; 257/E29.248; 257/E29.033; 257/E29.081; 257/E29.085; 257/E29.091; 257/E29.097

(58) Field of Classification Search
USPC ............. 257/57, 77, 194, 200, 201, 192, 196, 257/197, E29.081, E29.091, E21.371, 257/E21.373, E21.403, E21.407, E29.242, 257/728, 723–725, 275, 782, 625, 676, 257/E27.137, E27.144, E23.021, E23.062, 257/213, E29.033, E29.084, E29.085, 257/E29.097, E29.096, E29.246, E29.248; 117/94; 438/167, 186, 234, 312, 172, 438/191, 235, 316

See application file for complete search history.

(56) References Cited

U.S. PATENT DOCUMENTS

| | | | |
|---|---|---|---|
| 6,049,099 A * | 4/2000 | Vaccaro et al. | 257/200 |
| 6,737,684 B1 * | 5/2004 | Takagi et al. | 257/194 |
| 2001/0019879 A1 | 9/2001 | Kravtchenko et al. | |
| 2003/0011000 A1 * | 1/2003 | Watanabe et al. | 257/197 |
| 2004/0009649 A1 | 1/2004 | Kub et al. | |
| 2005/0001213 A1 | 1/2005 | Tindall et al. | |
| 2007/0087525 A1 | 4/2007 | Chen et al. | |

OTHER PUBLICATIONS

Estrada, S. et al., "n-AlGaAs/p-GaAs/n-GaN heterojunction bipolar transistor wafer-fused at 550-750°C.," Appl. Phys. Lett., Jul. 21, 2003, pp. 560-562, vol. 83, No. 3.

Limb, J.B. et al., "High voltage operation (>80 V) of GaN bipolar junction transistors with low leakage," Appl. Phys. Lett., Apr. 24, 2000, pp. 2457-2459, vol. 76, No. 17.

(Continued)

*Primary Examiner* — Ermias Woldegeorgis
(74) *Attorney, Agent, or Firm* — Gates & Cooper LLP (57) ABSTRACT

A method for fabricating an electronic device, comprising wafer bonding a first semiconductor material to a III-nitride semiconductor, at a temperature below 550° C., to form a device quality heterojunction between the first semiconductor material and the III-nitride semiconductor, wherein the first semiconductor material is different from the III-nitride semiconductor and is selected for superior properties, or preferred integration or fabrication characteristics in the injector region as compared to the III-nitride semiconductor.

21 Claims, 4 Drawing Sheets

(56) References Cited

OTHER PUBLICATIONS

Palacios et al., "High-Power AlGaN/GaN HEMT's for Ka-Band Applications," IEEE Electron Device Letters, Nov. 2005, pp. 781-783, vol. 26, No. 11.

Pasquariello et al., "Plasma-Assisted InP-to-Si Low Temperature Wafer Bonding," IEEE Journal on Selected Topics in Quantum Electronics, Jan./Feb. 2002, pp. 118-131, vol. 8, No. 1.

Van de Walle, C.G. et al., "Universal alignment of hydrogen levels in semiconductors, insulators and solutions," Nature, Jun. 5, 2003, pp. 626-628, vol. 423.

Wu, Y.-F. et al., "30-W/mm GaN HEMT's by Field Plate Optimization," IEEE Electron Device Letters, 2004, pp. 117-119, vol. 25, No. 3.

International Search Report mailed Jan. 30, 2009, International application No. PCT/US08/62277, International filing date May 1, 2008.

* cited by examiner

METHOD USING LOW TEMPERATURE WAFER BONDING TO FABRICATE TRANSISTORS WITH HETEROJUNCTIONS OF SI(GE) TO III-N MATERIALS

CROSS-REFERENCE TO RELATED APPLICATIONS

This application is a continuation under 35 U.S.C. §120 of the following and commonly-assigned U.S. patent application:

U.S. application Ser. No. 12/113,847, filed on May 1, 2008, by Umesh K. Mishra and Lee S. McCarthy, entitled "METHOD USING LOW TEMPERATURE WAFER BONDING TO FABRICATE TRANSISTORS WITH HETEROJUNCTIONS OF Si(Ge) TO III-N MATERIALS," which application claims the benefit under 35 U.S.C. §119(e) of U.S. Provisional Patent Application Ser. No. 60/915,334, filed on May 1, 2007, by Umesh K. Mishra and Lee S. McCarthy, entitled "METHOD USING LOW TEMPERATURE WAFER BONDING TO FABRICATE TRANSISTORS WITH HETEROJUNCTIONS OF Si(Ge) TO III-N MATERIALS";

both of which applications are incorporated by reference herein.

STATEMENT REGARDING FEDERALLY SPONSORED RESEARCH AND DEVELOPMENT

This invention was made with Government support under Grant No. FA9550-06-1-0089 (AFOSR). The Government has certain rights in this invention.

BACKGROUND OF THE INVENTION

1. Field of the Invention

The present invention relates to wafer bonding for electronic devices, for example, microwave and power electronics.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Recent advances in GaN device technology have shown significant promise for high performance transistors. Currently, GaN based transistors have the highest output power density for high frequency electronics with over 30 W/mm at 8 GHz [1], and 8.6 W/mm at 40 GHz [2]. Furthermore, discrete AlGaN/GaN high electron mobility transistors (HEMTs), with a rated output power as high as 180 W at 2.2 GHz, have recently been offered commercially by Eudyna (Fujitsu) for applications such as cell phone base stations, suggesting that these devices are both manufacturable and commercially viable.

While the unique properties of the III-Nitride (III-N) material system make the AlGaN/GaN HEMT an ideal candidate for microwave and high power electronics, the flexibility in design and function along with the integration available in more mature technologies, such as Si and the III-Arsenide (III-As) systems, offer exciting new possibilities when combined with the capabilities of GaN.

Although epitaxial growth techniques such as metalorganic chemical vapor deposition (MOCVD), molecular beam epitaxy (MBE), and hydride vapor phase epitaxy (HVPE) have traditionally been utilized to fabricate the material layer structures used in semiconductor devices, these epitaxial techniques are limited to materials of similar lattice constant, crystalline structure, and coefficient of thermal expansion. Wafer bonding, which joins two materials placed in intimate contact under elevated temperature and pressure, has proven to be effective in forming a number of heterogeneous devices from lattice-mismatched materials. These devices include GaAs/InP vertical-cavity and micro disk lasers, InGaAs/Si avalanche photodiodes, InGaAsP/AlGaAs photonic crystal lasers, and AlGaAs/GaAs/GaN heterojunction bipolar transistors (HBTs) [4].

The present invention uses wafer bonding to combine the capabilities of high speed injectors such as Si, SiGe, and the III-As or III-P system, with the high power collector capabilities of the III-N system.

SUMMARY OF THE INVENTION

The present invention proposes that wafer bonding can be used to fabricate transistors between Si, SiGe and compound semiconductors containing nitrogen such as gallium nitride. Using low temperature bonding techniques, materials with dissimilar thermal expansion coefficients such as Si, Ge, and GaN can be bonded to form heterojunctions that cannot be readily grown with high quality using conventional epitaxial techniques. This invention describes a method using low temperature bonding to fabricate opto-electronic and electronic devices which combine the benefits of Si or SiGe with the III-N material system. In particular, these devices include high voltage transistors combining enhancement mode Si CMOS based injectors with III-N based electron collector or drain structures. This can also include Si/SiGe heterojunction bipolar injectors with a III-N based collector, as well as opto-electronic devices such as solar cells, light emitting diodes (LEDs), and photo-detectors. Si or Si/Ge injector structures may be bonded to either the Ga-face, the N-Face or some other crystal orientation of the III-N collector or drain structures, and may include intermediate layers such as GaP, InP or other materials to enhance the bond strength or to reduce barriers to electronic conduction.

The present invention discloses a method for fabricating an electronic device, comprising wafer bonding a first semiconductor material to a second semiconductor material, at a temperature below 550° C., to form a device quality heterojunction between the first semiconductor material and the second semiconductor material, wherein the second semiconductor material is a III-nitride and the first semiconductor material has a different material composition from the second semiconductor material.

The method may further comprise forming one or more injector regions in the first semiconductor material prior to, or subsequent to, the wafer bonding step, wherein the first semiconductor material is not a III-nitride. The first semiconductor material may have superior properties for the injector region as compared to the second semiconductor material. The superior properties may be a higher speed of the injector region, higher electron mobility, lower access resistance, or a combination thereof. The first semiconductor material may have a different lattice constant, thermal properties, and crystalline structure as compared to the second semiconductor material, such that the device quality heterojunction cannot be epitaxially grown. The first semiconductor material may be Si, SiGe, Si and SiGe, GaP, InP, GaInP or a III-P compound, III-As, or a III-As compound.

The method may further comprise introducing In, InP, or a III-P or III-As compound on a bonding face of the first semiconductor material or second semiconductor material, prior to the wafer bonding step.

A device may be fabricated using the method, for example, a heterojunction bipolar transistor or field effect transistor.

The present invention further discloses an electronic device, comprising a semiconductor material including one or more injector regions; a III-nitride material including one or more collector, drain or active regions; and a device quality heterojunction formed between the semiconductor material and the III-nitride, wherein the semiconductor material is not a III-nitride, the injector regions have one or more superior properties as compared to III-nitride injector regions, and the superior properties include higher speed of the injector region, higher electron mobility, lower access resistance, or a combination thereof.

The device may further comprise a wafer bond formed between the semiconductor material and the III-nitride to form the device quality heterojunction for reducing thermal mismatch strain, dislocation distribution and impurity distribution in the device.

The device may further comprise an intermediate region between the semiconductor material and the III-nitride, for enhancing bond strength and conductivity of the device quality heterojunction, wherein the intermediate region is selected from a group comprising In, InP, a III-P or III-As compound, and is on a bonding face of the semiconductor material or III-nitride material.

The injector regions may have reduced dopant diffusion and current leakage as compared to a heterojunction formed at a temperature above 550° C. The injector and collector or drain regions may be unipolar. The semiconductor material may be selected from a group comprising Si, SiGe, or Si and SiGe, III-As or a III-As compound.

The device may be a heterojunction bipolar transistor (HBT) or a field effect transistor (FET), for example.

The HBT may further comprise an emitter region; a base region between the emitter region and the collector regions; the collector regions including a first collector layer and a second collector layer, wherein the second collector layer, on the first collector layer, is doped with a same charge carrier type as the first collector layer but with a smaller charge concentration; the semiconductor material selected from a group comprising Si, SiGe, Si and SiGe, GaP, InP, GaInP or a III-P compound, III-As, or a III-As compound, wherein the semiconductor material includes the injector region and the injector region includes the emitter region and the base region; the III-nitride including the collector regions, wherein the III-nitride is gallium nitride (GaN); and a wafer bond formed between the base region of the semiconductor material and the second collector layer of the GaN, thereby forming the device quality heterojunction between the base region and the second collector layer.

The FET may further comprise a source region; a semiconducting region between the source region and the drain region; a first drift region between the semiconducting region and the drain region; and a second drift region between the first drift region and the drain region, wherein: the semiconductor material is silicon and includes the injector region and the first drift region, and the injector region includes the source region and the semiconducting region; the III-nitride is gallium nitride (GaN) and includes the second drift region and the drain region; the first drift region is doped with a same charge carrier type as the drain region, but with a smaller charge concentration than the drain region; and a wafer bond formed between the first drift region of the semiconducting material and the second drift region of the GaN, thereby forming the device quality heterojunction between the first drift region and the second drift region.

The present invention further discloses an electronic device fabricated using a process comprising wafer bonding a first semiconductor material to a second semiconductor material at a temperature below 550° C. to form a device quality heterojunction between the first semiconductor material and the second semiconductor material; wherein the first semiconductor material includes one or more injector regions, and the second semiconductor material includes one or more active regions; and wherein the second semiconductor material comprises a III-nitride semiconductor, the first semiconductor material is different from the second semiconductor material, and the first semiconductor material is selected for superior properties in the injector region as compared to the second semiconductor material. The active region may be a collector, drain, channel, light emitting region, or light sensitive region.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention proposes merging the injector properties of Si and/or Si/SiGe with the collector properties of the III-N material system (using the Ga-face, N-face or other orientations) of III-N structures such as GaN or AlGaN/GaN using wafer bonded heterojunctions.

Technical Description

Figure 1:
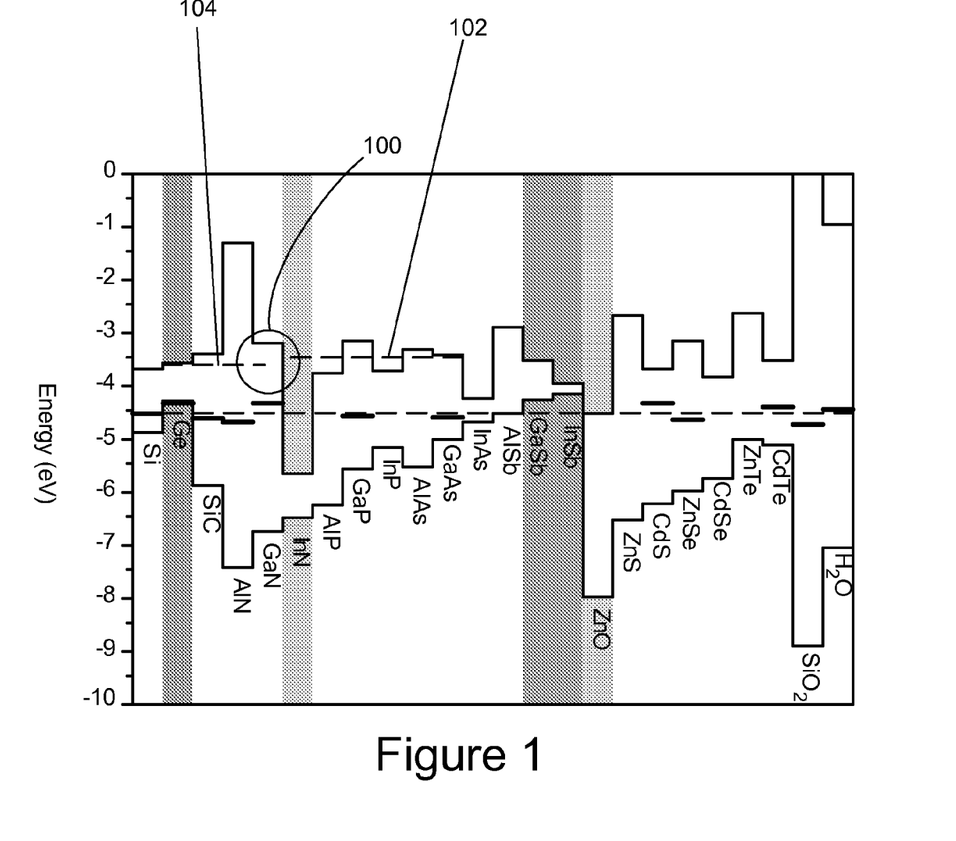
FIG. 1 is a graph showing the conduction band and predicted band line-up for various semiconductors predicted by universal hydrogen level with the circled area indicating the predicted line-up of SiGe to GaN.

For electronic devices to take advantage of wafer bonded heterojunctions, the conduction and valence band energy lineup must be favorable. Van De Walle and Neugebauer have predicted the band lineups of several semiconductor systems [3]. FIG. 1, which is based on the predicted line-ups [3], is a graph plotting the conduction band minimum and valence band maximum of various semiconductors and insulators, showing the favorable conduction band lineup of Si, and SiGe with GaN, wherein the circled area 100 indicates the predicted line-up of SiGe to GaN, the dashed line 102 is a guide line to show the conduction band line-up of GaAs with GaN, and the dashed line 104 is a guide line to show the conduction band line-up of Ge with GaN.

Incorporation of indium (In) or other materials into the bonding face of III-N collector structures may also be used to fine-tune this lineup to create extremely low conduction band barriers across bonded interfaces.

TABLE 1

Material property comparison of GaN and Si

| Properties | Si | GaN |
|---|---|---|
| Bandgap (eV) | 1.11 | 3.4 |
| Breakdown field (V/cm) | $3 \times 10^5$ | $33 \times 10^5$ |
| Saturated Velocity (cm/s) | $1 \times 10^7$ | $2.4 \times 10^7$ |

Table 1 shows a few key material properties relevant to high power switching and communications devices in Si and GaN. With superior electron saturation velocities and breakdown fields, GaN is an ideal candidate for both power switching and communications electronics. The increase in bandgap leads to higher breakdown fields, allowing the use of thinner collector/drain layers, while the increased saturated electron velocities (combined with the thinner drift region) leads to transit times which are reduced by more than an order of magnitude. Combining this performance with the injector performance and integration available to Si, SiGe, the present invention is for providing high performance devices with applications ranging from microwave and mm-wave communications to high voltage switching. To address this wide range of possible applications, the present invention discloses and investigates the following device designs.

Si/SiGe/GaN or Si/GaN Heterojunction Bipolar Transistor (HBT)

Figure 2:
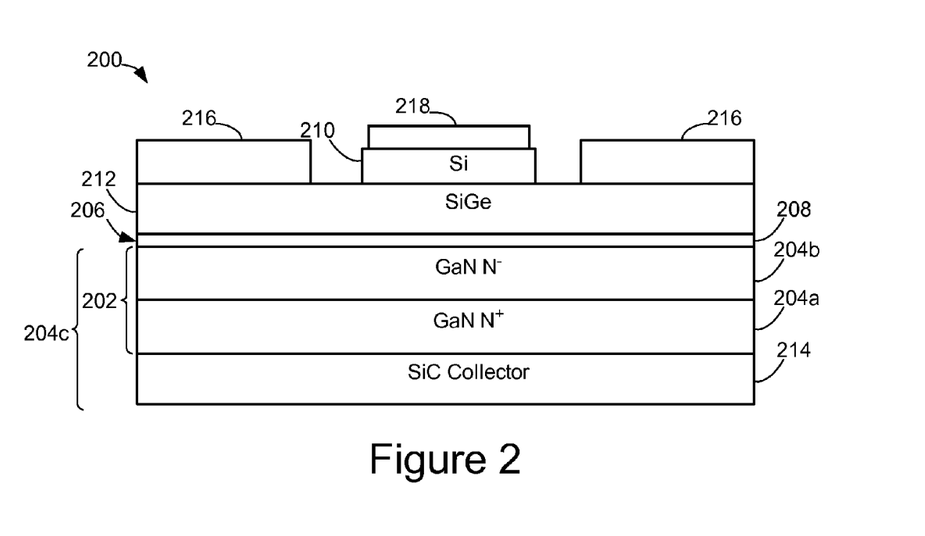
FIG. 2 is a schematic of a wafer bonded Si/SiGe/GaN DHBT.

FIG. 2 is a schematic of a wafer bonded Si/SiGe/GaN Dual Heterojunction Bipolar Transistor (DHBT) 200, comprising a semiconductor material including an injector region (described below), a III-nitride material 202 including one or more collector regions, in this case two collector regions 204a, 204b, forming part of a collector structure 204c, a device quality heterojunction 206 between the semiconductor material and the III-nitride 202, and a wafer-bond 208 between the semiconductor material and the III-nitride 202 to form the device quality heterojunction 206.

The DHBT 200 further comprises an emitter region 210, and a base region 212 between the emitter region 210 and the collector structure 204c. The collector structure 204c comprises a first GaN collector layer 204a between a second GaN collector layer 204b and a SiC collector layer 214. The second collector layer 204b may be the active part of the collector structure 204c. The first collector layer 204a and the SiC collector layer 214 may be subcollectors. The second collector 204b is doped with a same charge carrier type (n⁻ type or GaN N⁻) as the first collector 204a (n⁺-type or GaN N⁺), but with a smaller charge concentration than the charge concentration in the first collector 204a.

The semiconductor material comprises Si and SiGe, and includes the emitter region 210 (comprised of Si) and the base region 212 (comprised of SiGe). The injector region comprises the emitter region 210 and the base region 212.

The III-nitride 202 is GaN and includes the second collector layer 204b on the first collector layer 204a.

The wafer-bond 208 between the base region 212 of the semiconductor material and the second collector layer 204b of the GaN 202 forms the heterojunction 206 between the base region 212 and the collector region/structure 204c.

The base layer 212 has contacts 216, and the emitter layer 210 has contact 218. The SiC 214 is optional.

SiGe Bipolar Complementary Metal Oxide Semiconductor (BiCMOS) ICs are overtaking GaAs based devices in a number of high frequency applications. The combination of GaN with SiGe can increase the frequency of operation at high power densities and provide high performance integrated communications functionality on a single die. Because of the higher breakdown voltage associated with the GaN collector, Si/SiGe/GaN DHBTs (as illustrated in FIG. 2, for example) can offer a higher combination of operating frequency and voltage than conventional bipolar transistors. The present invention uses Si/SiGe/III-N DHBTs to extend the output power capability of conventional Si/SiGe HBTs, and Si/III-N HBTs to extend Si bipolar structures for high voltage switching applications. The GaN collector structure 202 can lead to increased voltage swing with the same emitter/base structure as conventional SiGe HBTs and Si bipolar junction transistors (BJTs), leading to high frequency devices combining the advantages of Si/SiGe HBT technology with GaN high power capability.

Compared to field effect devices, bipolar transistors are normally off, and typically have lower on-state power dissipation. Device fabrication may include front-side conventional SiGe or Si process steps including ion implantation, metallization, etc., followed by wafer transfer to a GaN vertical collector structure 202 or an AlGaN/GaN lateral collector (or drain) structure and low temperature direct wafer bonding.

Si Vertical Double Diffused Metal Oxide Semiconductor (VDMOS)

Figure 3:
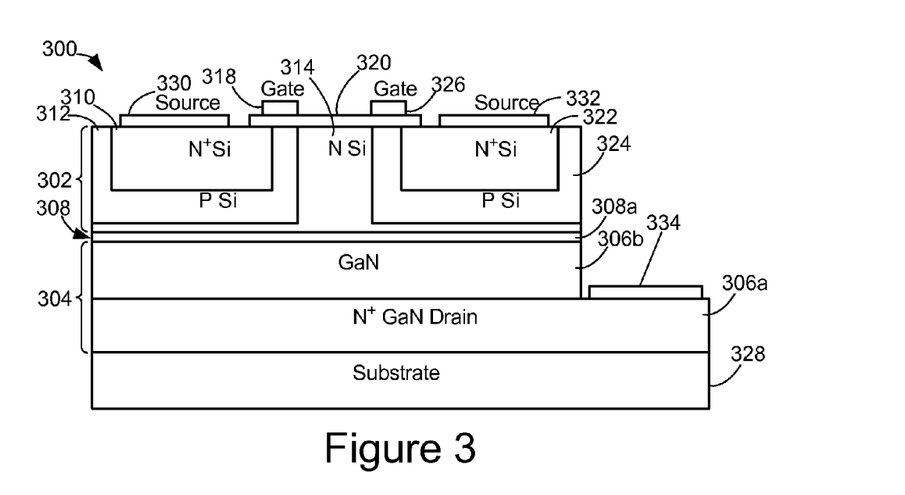
FIG. 3 is a schematic of an Si/GaN VDMOS device.

FIG. 3 is a schematic of an Si/GaN VDMOS device 300, comprising a semiconductor material 302 including two injector regions (described below), a III-nitride material 304 including one or more drain regions, in this case two drain regions 306a, 306b, a device quality heterojunction 308 between the semiconductor material 302 and the III-nitride 304, and a wafer bond 308a between the semiconductor 302 and the III-nitride 304 to form the device quality heterojunction 308.

The semiconductor material 302 is not a III-nitride and the injector regions have one or more superior properties as compared to III-nitride injector regions and the superior properties are higher speed of the injector region, higher electron mobility, lower access resistance, or a combination of these superior properties.

A first Field Effect Transistor (FET) of the device 300 comprises a first source region 310 (n⁺-type Si or N⁺ Si), drain regions 306a, 306b, a first semiconducting region 312 (p-type Si or P Si) between the first source region 310 and the first drain region 306a, a first drift region 314 (n-type Si or N Si) between the first semiconducting region 312 and the first drain region 306a, and a second drain region 306b between the first drift region 314 and the first drain region 306a, wherein the semiconductor material 302 is Si and includes the first injector region and the first drift region 314, and the first injector region comprises the first source region 310 and the first semiconducting region 312.

The III-nitride 304 is gallium nitride (GaN) and includes the drain regions 306a, 306b, and the drain region 306b is a second drift region on the first drain region 306a. In this case, layer 306a is the drain, and layers 306b and 314 are drift regions.

The first drift region 314 is doped with a same charge carrier type (n-type) as the drain region 306a (n⁺-type or N⁺ GaN), but with a smaller charge concentration than the charge concentration of the drain region 306a (the first drift region 314 is doped n-type, and the GaN drain region 306a is doped n⁺-type). The second drift layer (GaN) 306b may also be doped n-type, smaller than the n⁺-type doping of the drain layer 306a. Alternatively, the first drift region 314 and the second drift region 306b may be additional drain layers.

The wafer-bond 308a between the first drift region 314 of the semiconducting material 302 and the second drift region 306b of the GaN 304 forms the heterojunction 308 between the first drift region 314 and the second drift region 306b.

The first FET further comprises a gate 318, separated from the first injector region by an insulator 320.

The device 300 comprises a second FET, comprising a second n$^+$-type Si source region 322, drain regions 306a, 306b, a second semiconducting region (p-type Si) 324 between the second source region 322 and the first drain region 306a, the first drift region 314 (n-type Si) between the second semiconducting region 324 and the first drain region 306a, and the second drain region 306b between the first drift region 314 and the first drain region 306a, wherein the semiconductor material 302 is Si and includes the second injector region and the first drift region 314. The second injector region comprises the second source region 322 and the second semiconducting region 324.

The second FET further comprises a gate 326, separated from the second injector region by an insulator 320.

The first GaN drain 306a is between a substrate 328 and the second GaN drain 306b. The substrate 328 also a drain region, but is optional. The first source 310 has contact 330, the second source 322 has contact 332, and the drain 306a has contact 334. The FETs may be MOSFETs, for example, or any other device structure using the layers of FIG. 3.

The combination of Si VDMOS and GaN (as illustrated in FIG. 3, for example) can increase the performance of high voltage switching devices. The Si VDMOS injector has the advantages of normally-off operation, low on-resistance, and the sophisticated manufacturing and integration capabilities associated with Si CMOS. The high critical fields (2 MV/cm) and saturated electron velocities ($2.4 \times 10^7$ cm/s) of a GaN collector can reduce the drain drift region thickness by approximately 10 times, and electron transit times by as much as 20 times. The device of this embodiment may be processed using conventional Si processing techniques, and then transferred to a GaN film grown on Si or SiC to form a wide-bandgap drain. Improvements in transistor switching speed lead to reductions in the sizes of passive components, and integration with conventional CMOS or BiCMOS may lead to gains in size and cost efficiency.

AlGaAs/GaAs/GaN DHBT with a Lateral Collector

Figure 4:
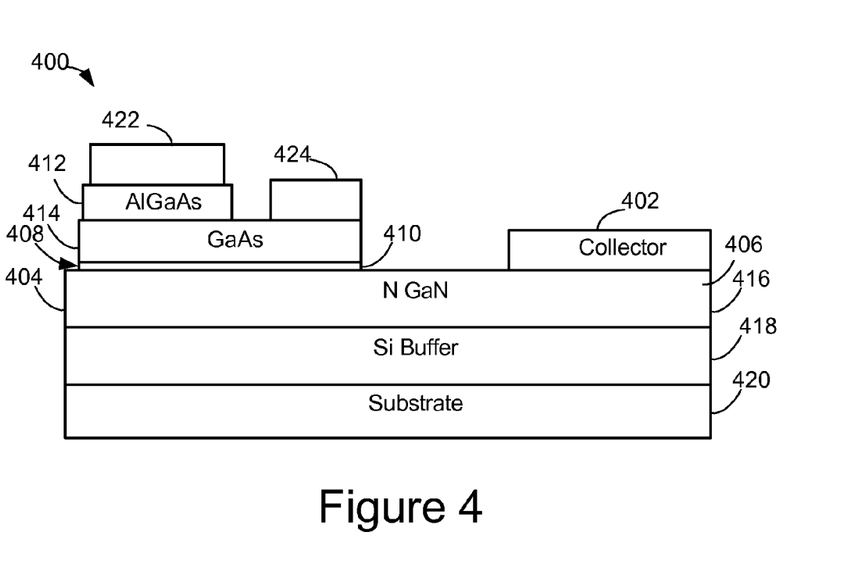
FIG. 4 is a schematic of an AlGaAs/GaAs/GaN DHBT with a lateral collector.

FIG. 4 is a schematic of an AlGaAs/GaAs/GaN DHBT 400 comprising a lateral collector contact 402. The DHBT further comprises a semiconductor material including an injector region (described below), a III nitride 404 including a collector region 406, a heterojunction 408 between the semiconductor and the III-nitride 404, and a wafer bond 410 for wafer-bonding the injector region 404 to the collector region 406 and forming the heterojunction 408.

The injector region comprises an AlGaAs emitter layer 412 and a GaAs base layer 414. The collector region 406 comprises an n-type GaN layer 416. The n-type GaN layer (N GaN collector) 416 is on a Si buffer 418 which is on a substrate 420.

The wafer bond 410 wafer bonds the n-type GaN 416 to the GaAs base 414, so that the heterojunction is between the collector 416 and the base 414. A collector contact 402 is made to the n-type GaN 416, an emitter contact 422 is made to the AlGaAs emitter 412, and a base contact 424 is made to the GaAs base 414.

Device Fabrication

The present invention also develops wafer bonding technology for low temperature bonding of GaN to Si and GaAs. Si/Si and Si/InP direct wafer bonding reports have shown that strong electrically conductive bonds can be formed between Si wafers or Si and InP wafers with anneal temperatures as low as 250° C. [6]. The present invention applies this process to GaN wafer bonding, allowing the maximum fabrication flexibility, along with the advantages of reduced thermal mismatch strain and dislocation or impurity distribution associated with high temperature processes. A plasma activation system may be used for low temperature wafer bonding. The bonding of Si and GaAs to GaN is characterized to determine optimum plasma activation conditions as evaluated by physical bond strength. Devices include P-N and N-N heterojunctions to characterize the interface and band-lineup of various material combinations. The present invention may use capacitance-voltage and temperature dependent current-voltage measurements to characterize conduction band discontinuities between bonded semiconductors. Transmission Electron Microscopy (TEM) may be used to characterize extended defects initiated at the bonded interfaces, and secondary ion mass spectroscopy may be used to determine contamination levels at interfaces, and their penetration into bulk bonded layers. These techniques may be used to evaluate various bonding techniques and material combinations, including various crystallographic orientations of bonded materials, bonding temperature, bonding ambient, and bonding surface preparation.

Building on the bonding methods developed above, for example, the present invention proposes transistors based on Si(Ge)/GaN and GaAs/GaN heterojunctions. Evaluations of heterojunctions investigated in the preceding paragraph may guide efforts to fabricate devices most likely to succeed in transistor form. Transistor contact structures compatible with high frequency measurements may be fabricated and characterized to determine transit delay across bonded junctions. Temperature dependent DC and RF measurements may be used to characterize bonded devices. Extensive electronic measurement capabilities, including large signal RF power to 40 GHz, and cryo-RF small signal measurements, may be used to characterize communications devices. Feedback from these measurements may be used to further improve wafer bonding methods to develop processes which maximize small signal and RF performance of transistors.

Improved bonding processes developed above may be implemented in new devices with structures optimized for bonded heterojunctions. In addition, more sophisticated device fabrication tools developed for GaN HEMTs may be incorporated, such as ion implantation of GaN and two dimensional electron gas (2DEG) Al(In)GaN/GaN collector structures. Various GaN substrate options such as freestanding GaN vs. GaN on Si, or GaN on SiC, may be evaluated and used. RF power measurements may be used to evaluate device design as well as process improvements, and structure design may be refined to maximize power performance.

Process Steps

Figure 5:
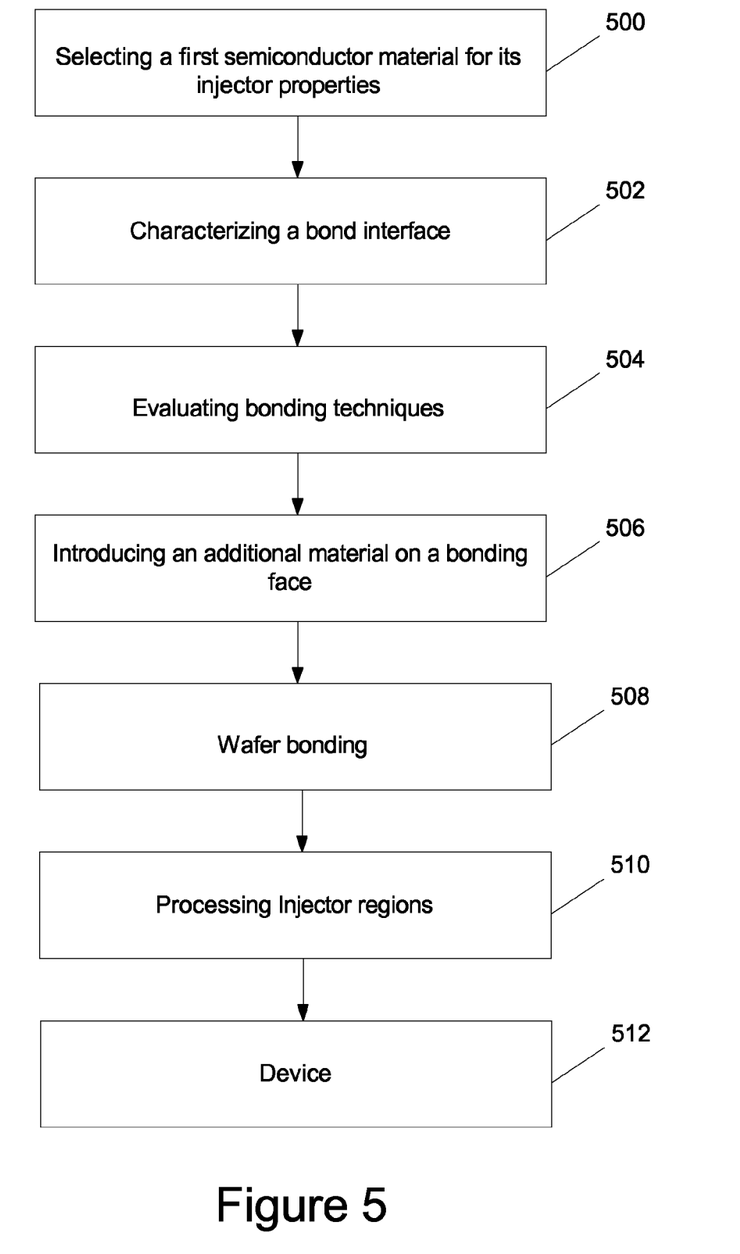
FIG. 5 is a flowchart illustrating a method of the present invention.

FIG. 5 is a flowchart illustrating a method for fabricating an electronic device, comprising one or more of the following steps:

Block 500 represents the step of selecting a first semiconductor material for its injector properties. The first semiconductor material may be selected because the first semiconductor material has superior properties for the injector region as compared to the second semiconductor material. The superior injector properties may be a higher speed of the injector region, higher electron mobility, lower access resistance, or a combination of these superior properties. The first semiconductor material may have a different lattice constant, thermal properties, and crystalline structure as compared to the second semiconductor material, such that the device quality heterojunction cannot be epitaxially grown. The first semiconductor material may be Si, SiGe, Si and SiGe, GaP, InP, GaInP or a III-P compound, III-As, or a III-As compound, for example. The first semiconductor material may be a non-III-nitride material.

Block 502 represents the step of characterizing a bond interface between the first semiconductor material and a III-nitride semiconductor material. For example, the characterizing may comprise measuring bond strength, conduction discontinuities, extended defects, contamination levels, and contamination penetration at the interface between the semiconductor material and the III-nitride. The step may further comprise characterizing the electrical, frequency, and/or optical response across the bonded interface.

Block 504 represents the step of evaluating various bonding techniques and material combinations based on the characterization of block 502, and choosing the best technique for a specific device application.

Block 506 represents the step of introducing In, InP, or a III-P or III-As compound on a bonding face of the first or second semiconductor material, prior to the wafer bonding step.

Block 508 represents the step of wafer bonding a first semiconductor material to a second semiconductor material, at a temperature below 550° C., to form a device quality heterojunction between the first semiconductor material and the second semiconductor material, wherein the second semiconductor material is a III-nitride and the first semiconductor material is different from the second semiconductor material.

Block 510 represents the step of processing one or more injector regions in the first semiconductor material prior to, or subsequent to, the wafer bonding step 508.

Block 512 represents a device fabricated using the above method. The device may be a heterojunction bipolar transistor or field effect transistor, for example. If the device is an optical device, such as a light emitting diode, diode laser, solar cell or photodetector, the injector region would include the n-type and/or p-type region, and the III-nitride would include the active light emitting region or active light sensitive region. The injector regions of the device may have reduced dopant diffusion and current leakage as compared to a heterojunction formed at a temperature above 550° C.

Block 512 also represents an electronic device fabricated using a process comprising wafer bonding a first semiconductor material to a second semiconductor material at a temperature below 550° C. to form a device quality heterojunction between the first semiconductor material and the second semiconductor material, wherein the first semiconductor material includes one or more injector regions, and the second semiconductor material includes one or more active regions, and wherein the second semiconductor material comprises a III-nitride semiconductor, the first semiconductor material has a different material composition from the second semiconductor material, and the first semiconductor material is selected for superior properties in the injector region as compared to the second semiconductor material. The active region may be a collector, drain, channel, light emitting region, or light sensitive region.

Possible Modifications

The device 200 may be an HBT or a DHBT, for example. The device 200 may be an n-p-n or p-n-p transistor, and the source 310 and drain 306a may be n-type or p-type. The injector and collector or drain regions may be unipolar.

Devices 200, 300 may further comprise an additional intermediate region between the semiconductor material 302 and the III-nitride 304, for enhancing bond strength and conductivity of the heterojunction 308, wherein the additional intermediate region is selected, for example, from a group comprising In, InP, a III-P or III-As compound, and is on a bonding face of the semiconductor material 302 or III-nitride material 304.

Advantages and Improvements

The wafer bond between the semiconductor and the III-nitride to form the device quality heterojunction, may be for reducing thermal mismatch strain, dislocation distribution and impurity distribution in the semiconductor material and the III-nitride material.

REFERENCES

The following references are incorporated by reference herein:

1. Y.-F. Wu et al., "30-W/mm GaN HEMTs by Field Plate Optimization," *Electron Device Letters, IEEE*, vol. 25, no. 3, March 2004.
2. Palacios et al., "High-power AlGaN/GaN HEMTs for Ka-band applications", *Electron Device Letters, IEEE*, vol. 26, no. 11, pp. 781-783, November 2005.
3. Van De Walle and Neugebauer, "Universal alignment of hydrogen levels in semiconductors, insulators and solutions," *Nature*, vol. 423, June 2003.
4. S. Estrada et. al, "n-AlGaAs/p-GaAs/n-GaN heterojunction bipolar transistor wafer-fused at 550-750° C.," vol. 83, no. 3, pp. 560-562, July 2003.
5. H. Xing et al., "High voltage operation (>80 V) of GaN bipolar junction transistors with low leakage", *Applied Physics Letters*, 76, 2457 (2000).
6. Pasquariello et al., "Plasma-assisted InP-to-Si low temperature wafer bonding," *Journal on Selected Topics in Quantum Electronics*, vol. 8, no. 1, Janaury/February (2002).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An electronic device, comprising:
   a semiconductor material including an injector region;
   a III-nitride material including a collector region or a drain region; and
   a heterojunction formed between the semiconductor material and the III-nitride material, wherein the semiconductor material is not a III-nitride;
   wherein the semiconductor material comprises a material stack including a Si layer and a SiGe layer and the SiGe layer is between the Si layer and the III-nitride material.

2. The device of claim 1, wherein the III-nitride material is doped n-type.

3. The device of claim 1 wherein the device is a bipolar transistor.

4. The device of claim 1, further comprising a bonded interface between the semiconductor material and the III-nitride material.

5. The device of claim 1, wherein the semiconductor material has a different lattice constant, thermal properties, and crystalline structure as compared to the III-nitride material.

6. The device of claim 1, wherein the device is a field effect transistor.

7. An electronic device, comprising:
a semiconductor material including an injector region;
a III-nitride material including a collector region or a drain region; and
a heterojunction formed between the semiconductor material and the III-nitride material,
wherein the semiconductor material is not a III-nitride and the semiconductor material includes a structure comprising $n^+$-type Silicon (Si), p-type Si, and n-type Si and the n-type Si is adjacent to the III-nitride material.

8. The device of claim 7, wherein the device is a field effect transistor.

9. A device, comprising:
a semiconductor material including an injector region;
a III-nitride material including a collector region or a drain region; and
a heterojunction formed between the semiconductor material and the III-nitride material, wherein the semiconductor material is not a III-nitride; and
an intermediate material region between the semiconductor material and the III-nitride material, the intermediate material region being selected from the group consisting of In, InP, a III-P compound, and a III-As compound.

10. The device of claim 9, wherein the semiconductor material comprises a material stack including a Si layer and a SiGe layer.

11. The device of claim 10, wherein the SiGe layer is between the Si layer and the III-nitride material.

12. The device of claim 10, wherein the III-nitride material is doped n-type.

13. The device of claim 10, wherein the device is a bipolar transistor.

14. The device of claim 9, wherein the semiconductor material comprises silicon (Si).

15. The device of claim 9, wherein the semiconductor material includes a structure comprising $n^+$-type Silicon (Si), p-type Si, and n-type Si.

16. The device of claim 15, wherein the n-type Si is adjacent to the III-nitride material.

17. The device of claim 9, wherein the device is a field effect transistor.

18. The device of claim 9, further comprising a bonded interface between the semiconductor material and the III-nitride material.

19. The device of claim 9, wherein the semiconductor material has a different lattice constant as compared to the III-nitride material.

20. The device of claim 9, wherein the semiconductor material has a different crystalline structure as compared to the III-nitride material.

21. The device of claim 9, wherein the semiconductor material has different thermal properties as compared to the III-nitride material.

* * * * *